United States Patent
Williams et al.

(12) 
(10) Patent No.: US 6,237,107 B1
(45) Date of Patent: *May 22, 2001

(54) DYNAMIC SLEW RATE CONTROL OUTPUT BUFFER

(75) Inventors: Timothy J. Williams, Bellevue; Warren S. Snyder, Snohomish, both of WA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,799

(22) Filed: Oct. 7, 1998

(51) Int. Cl.$^7$ .................................................. G06F 1/04
(52) U.S. Cl. ............................................... 713/503
(58) Field of Search ................................ 713/400, 503

(56) References Cited

U.S. PATENT DOCUMENTS

| | | | | |
|---|---|---|---|---|
| 5,424,657 | * | 6/1995 | Brunt et al. ............................ | 326/63 |
| 5,592,510 | * | 1/1997 | Brunt et al. ............................ | 375/220 |
| 5,675,813 | | 10/1997 | Holmdahl .............................. | 395/750 |
| 5,872,473 | * | 2/1999 | Williams ............................... | 327/108 |
| 5,883,531 | * | 3/1999 | Kuo ....................................... | 327/108 |
| 6,005,890 | * | 12/1999 | Clow et al. ............................ | 375/221 |

FOREIGN PATENT DOCUMENTS 9736230     10/1997     (WO) .

OTHER PUBLICATIONS

Design Guide for a Low Speed Buffer for the Universal Serial Bus, Revision 1.1, Dec. 1996, Intel Corporation, pp. 1–29.

Universal Serial Bus Specification, Chapter 7—Jan. 15, 1996, pp. 111–143.

* cited by examiner

*Primary Examiner*—Dennis M. Butler
(74) *Attorney, Agent, or Firm*—Christopher P. Maiorana, P.C.

(57) ABSTRACT

A circuit comprising an output circuit, an adjustment circuit and a detect circuit. The output circuit may be configured to present a first and second output in response to (i) a first and second control signal and (ii) an input signal. The slew rate adjustor circuit may be configured to present the first and second control signals in response to a third control signal. The detect circuit may be configured to present the third control signal in response to the first and second output signals. The slew rate adjuster circuit may dynamically adjust a slew rate of the first and second output signals to minimize common-mode changes.

20 Claims, 4 Drawing Sheets

DYNAMIC SLEW RATE CONTROL OUTPUT BUFFER

FIELD OF THE INVENTION

The present invention relates to output buffers generally and, more particularly, to a dynamic slew rate control output buffer.

BACKGROUND OF THE INVENTION

Complementary output buffers may be used in devices such as the Universal Serial Bus. Conventional approaches to presenting a complementary differential output include implementing two separate differential output drivers. Referring to FIG. 1, an output driver 10 is shown receiving an input signal IN and an output driver 12 is shown receiving an input signal INB. The output driver 10 presents a signal A and the output driver 12 presents a signal B. The output drivers 10 and 12 provide a complementary differential output. Since the output driver 10 and the output driver 12 operate independently, it is difficult to inherently match the outputs. Additionally, it may be impractical to produce two sets of output buffers that operate over a wide load and signal swing such as a Universal Serial Bus device.

The output driver 10 is required to provide rising edge circuitry to present the signal A that matches the falling edge circuitry of the output driver 12 to present the signal B. The implementation of separate circuitry results in poor control of parameters like the crossover voltage of the signal A and the signal B and the rise-time/fall-time ratio.

Another solution would be to implement the output drivers 10 and 12 using operational amplifiers. However, operational amplifier drivers are difficult to design to handle large loads with sufficient bandwidth to operate with Universal Serial Bus devices. Additionally, operational amplifier devices may be difficult to design to operate over a wide output swing with a low voltage operation.

SUMMARY OF THE INVENTION

The present invention concerns a circuit comprising an output circuit, an adjustment circuit and a detect circuit. The output circuit may be configured to present a first and second output in response to (i) a first and second control signal and (ii) an input signal. The slew rate adjustor circuit may be configured to present the first and second control signals in response to a third control signal. The detect circuit may be configured to present the third control signal in response to the first and second output signals. The slew rate adjuster circuit may dynamically adjust a slew rate of the first and second output signals to minimize common-mode changes.

The objects, features and advantages of the present invention include providing a common-mode circuit that detects movement in a common-mode point that may be used to indicate that the edges are not matching to provide control of (i) the crossover voltage of the outputs, (ii) the rise-time/fall-time ratio and/or (iii) other important factors to devices such as a Universal Serial Bus device.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
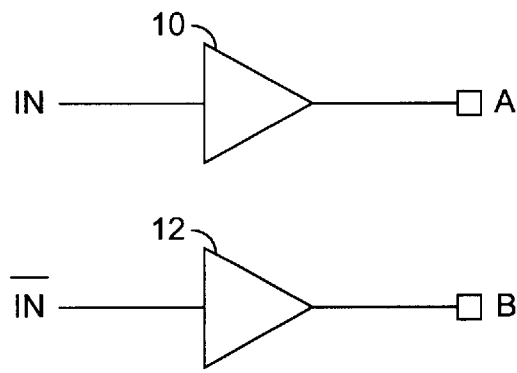
FIG. 1 is a block diagram of a conventional approach for generating a differential output signal.
Figure 2:
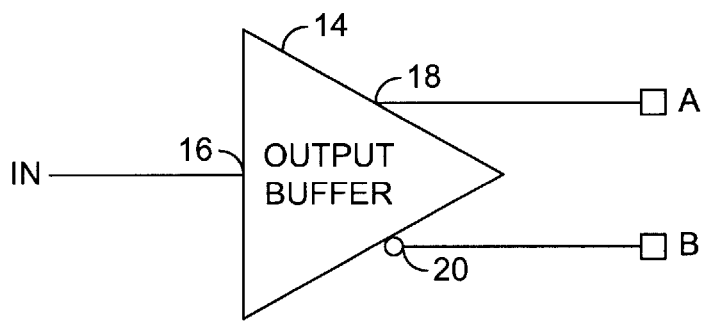
FIG. 2 is a block diagram of a preferred embodiment of the present invention.

Referring to FIG. 2, a block diagram of an output buffer 14 is shown in accordance with a preferred embodiment of the present invention. The output buffer 14 may receive a signal (e.g., IN) at an input 16 and may present a first output signal (e.g., A) and a second output signal (e.g., B) at an output 18 and an output 20, respectively. In general, the signal B presented at the output 20 is a digital complement of the signal A presented at the output 18.

Figure 3:
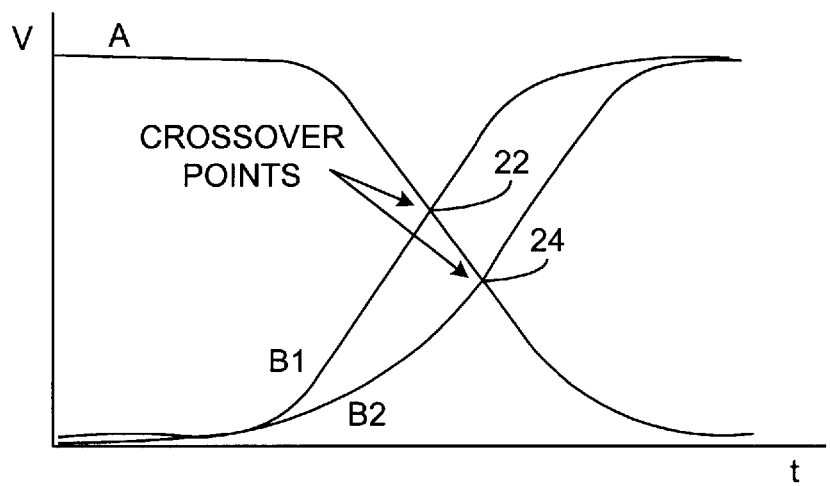
FIG. 3 is a timing diagram illustrating the operation of the circuit of FIG. 2.

Referring to FIG. 3, a timing diagram illustrating the output A and output B is shown. The x-axis generally represents a time domain (e.g., t) and the y-axis generally represents a voltage domain (e.g., v). The signal B is shown as a first signal B1 and a second signal B2. The signal B1 generally crosses the signal A at a crossover (or common-mode) point 22. The signal B2 generally crosses the signal A at a crossover (or common-mode) point 24. Ideally, the crossover points 22 and 24 occur at a point half way between the high and low voltages of the signals A and B.

Figure 4:
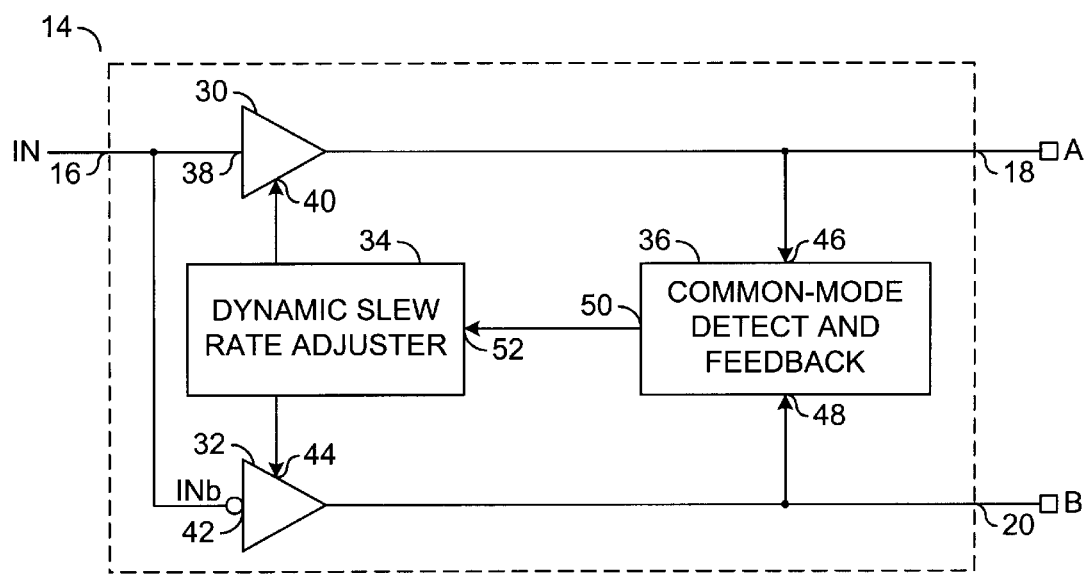
FIG. 4 is a more detailed block diagram of an embodiment of the present invention.

Referring to FIG. 4, a more detailed block diagram of the output buffer 14 is shown. The common-mode detect feedback circuit 36 generally detects movement in the common-mode point, indicating that the edges are not matched. In general, the lagging edge is "boosted" to catch up to the non-lagging edge. The common-mode detect and feedback block 36 may be used to equalize the common-mode point. The output buffer 14 generally comprises a circuit 30, a circuit 32, a dynamic slew rate adjuster block (or circuit) 34, and a common-mode detect and feedback block (or circuit) 36. The circuit 30 may have an input 38 that may receive the signal IN and an input 40 that may receive a control signal from the dynamic slew rate adjuster block 34. The circuit 32 has an input 42 that may receive a signal INB (that may be a digital complement of the signal IN) as well as an input 44 that may receive the signal from the dynamic slew rate adjustor block 34. The common-mode detect and feedback block 36 has an input 46 that may receive the signal A and an input 48 that may receive the signal B. The common-mode detect feedback block 36 has an output 50 that may present a control signal to an input 52 of the dynamic slew rate adjuster circuit 34.

Figure 5:
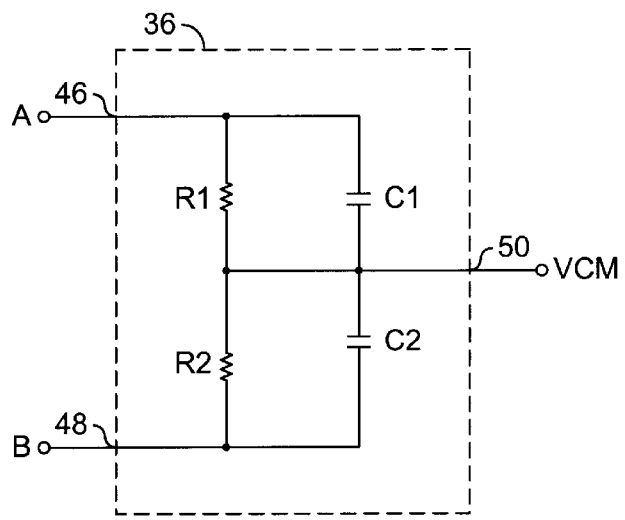
FIG. 5 is a diagram of the common-mode detect and feedback feature.

Referring to FIG. 5, a circuit diagram of the common-mode detect and feedback circuit 36 is shown. The circuit 36 comprises a capacitor C1, a capacitor C2, a resistor R1 and a resistor R2. The capacitor C1 may receive the signal IN at the input 46 and the signal INB at the input 48. The capacitor C1 and the capacitor C2 are generally coupled together to present an output signal (e.g., a common-mode voltage Vcm). The resistor R1 is generally coupled between the input 46 and the output 50. The resistor R1 is D generally connected in parallel with the capacitor C1. The resistor R2 is generally coupled between the input 48 and the output 50. The resistor R2 is generally coupled in parallel with the capacitor C2. In general, the resistor R1 and the resistor R2 are fabricated to have an equal resistance. Similarly, the capacitor C1 and the capacitor C2 are also fabricated to have an equal capacitance. In a preferred embodiment, the resistors R1 and R2 may be sized as an infinite resistance so that the capacitors C1 and C2 may provide the common mode detection.

Figure 6:
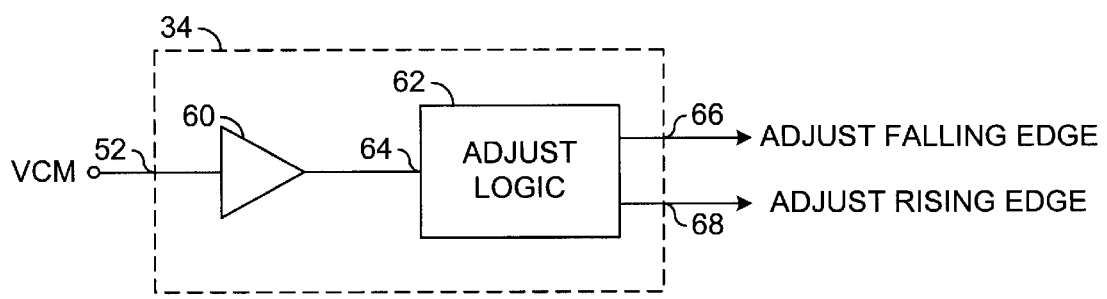
FIG. 6 is a block diagram of the dynamic slew rate adjuster circuit.

Referring to FIG. 6, a block diagram of the dynamic slew rate adjuster circuit 34 is shown. The circuit 34 generally comprises an amplifier 60 and an adjust logic block (or circuit) 62. The amplifier 60 may be implemented as an operational amplifier or other suitable gain circuit. The amplifier 60 generally receives the signal Vcm and may present a signal to an input 64 of the adjust logic block 62. The adjust logic block 62 may present a first signal at an output 66 and a second signal at an output 68. The first signal presented at the output 66 may be used to adjust the falling edge of a waveform and the second signal presented at the output 68 may be used to adjust the rising edge of a waveform.

Figure 7:
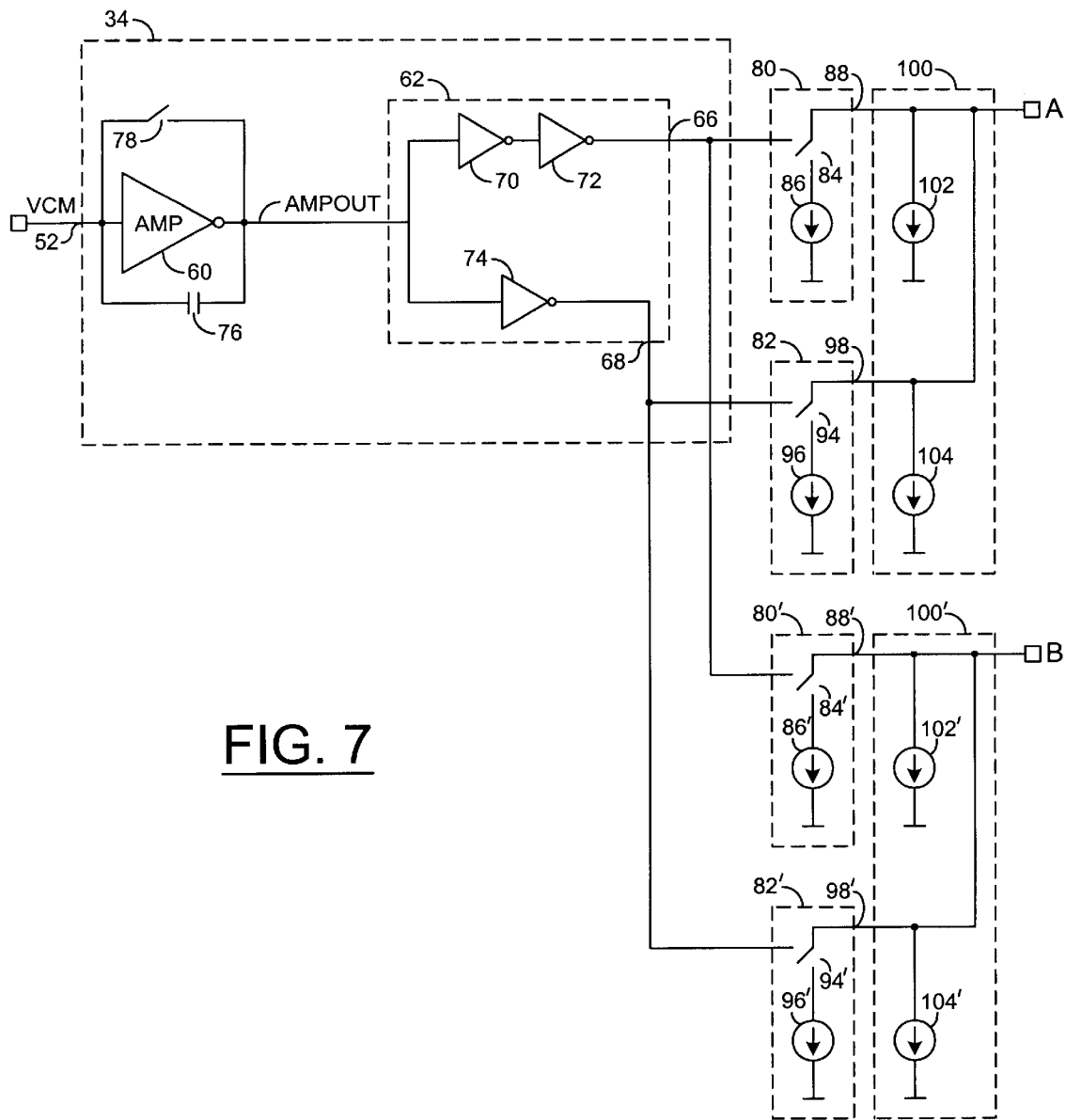
FIG. 7 is a more detailed diagram of the dynamic slew rate adjuster circuit.

Referring to FIG. 7, a more detailed diagram of the dynamic slew rate adjuster circuit 34 is shown. The adjust logic block 62 generally comprises an inverter 70, an inverter 72 and an inverter 74. The inverter 70 is generally implemented as a high threshold inverter. In general, the threshold of the inverter 70 should be set so that when the output of the amplifier 60 exceeds the threshold, the inverter 70 may present a signal to the inverter 72, which may then be presented to the output 66. The inverter 74 is generally implemented as a low threshold inverter. The threshold of the inverter 74 is generally set so that when the signal presented from the amplifier 60 is below the threshold, the inverter 74 may present a signal at the output 68. The amplifier 60 is shown having a capacitor 76 and a switch 78. The capacitor 76 may be implemented as a filter capacitor. The switch 78 generally initializes the signal Vcm received at the input 52. The switch 78 may be closed before the output transition begins, which may set the input 52 at the threshold bias point of the amplifier 60. When the switch 78 is opened (which may be at or before the time the outputs begin to transition) the output of amplifier 60 generally moves in response to a shift in the signal Vcm, which may indicate a shift in the common-mode point of the outputs A and B.

FIG. 7 also illustrates a rising edge circuit 80 and a falling edge circuit 82. The rising edge circuit 80 generally comprises a switch 84 and a current source 86. When a signal is received from the output 66, the switch 84 generally closes, which adds the current source 86 into the path, which may provide additional bias for a boost to the rising edge of the output signal. The rising edge circuit 80 generally presents such a bias boost at an output 88. The falling edge circuitry 82 generally comprises a switch 94, a current source 96 and an output 98. When the switch 94 receives the signal from the output 68, the switch 94 generally closes, which adds the current source 96 into the path. By adding the current source 96, an additional bias current may be presented for a falling edge boost. The additional bias is generally presented at an output 98. The current source 86 is generally sized to be 10–50% of the size of the current source 102. The current source 96 is generally sized to be 10–50% of the size of the current source 104. The rising edge circuit 80', the falling edge circuit 82', the current source 86' and the current source 96' provide similar functions to present the output B.

FIG. 7 also illustrates an output section 100. The output section 100 generally comprises a current source 102 and a current source 104. An example of the output section 100 may be found in application "LOW SPEED DRIVER FOR USE WITH THE UNIVERSAL SERIAL BUS", Ser. No. 08/828,537, Filed Mar. 31, 1997, now issued as (U.S. Pat. No. 5,872,473) which is hereby incorporated by reference in its entirety. In general, the circuit 34 does not provide the additional bias currents for either a falling or rising edge until the signal Vcm shifts enough to trip either the positive threshold of the inverter 70 or the negative threshold of the inverter 74. When the signal Vcm does shift enough to trip the inverter 70 or the inverter 74, the appropriate edge boost is presented to re-center the voltage Vcm. The output section 100', the current source 102' and the current source 104' generally provide similar functions to present the output signal B.

Figure 8:
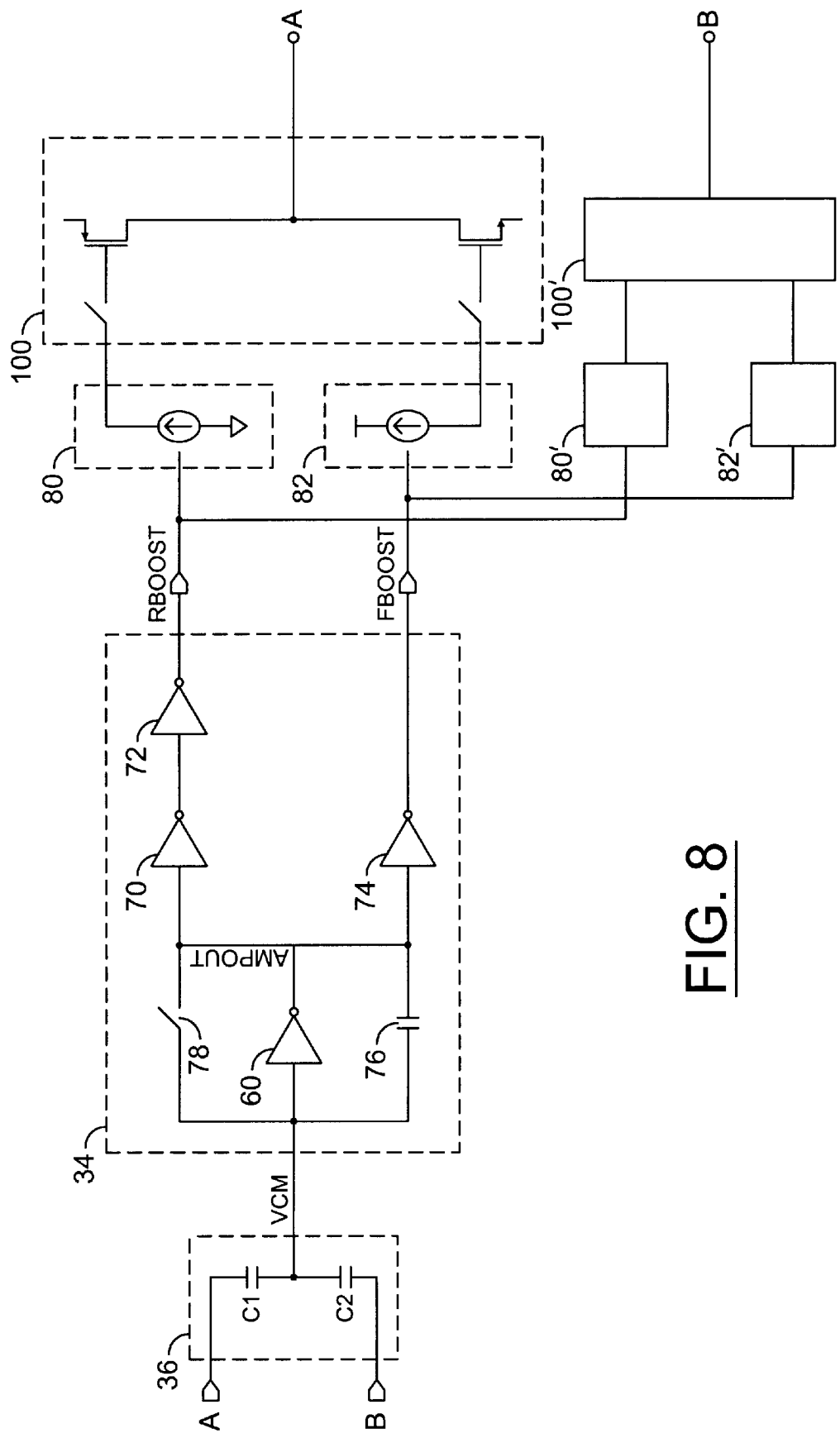
FIG. 8 is a circuit diagram of the present invention shown implemented with a portion of an output driver circuit.

Referring to FIG. 8, a circuit diagram of the various components described in connection with FIGS. 1–7 is shown. The capacitor C1 and C2 are shown having exemplary capacitances of 0.5 pF. However, the capacitance values may be adjusted to the design criteria of a particular application. For example, a capacitance value of between 0.25 pF and 1.0 pF may be appropriate. However, smaller capacitances or higher capacitances may be implemented accordingly. The capacitor C1 should be matched to the capacitor C2 to provide the proper detection of the signal Vcm. By matching the capacitance C1 with the capacitance C2, the common mode voltage Vcm may be controlled while keeping the rise and fall times of the output signals A and B approximately matched. The matching of the capacitances of the capacitor C1 and C2 may be done by implementing the capacitors at the same time and with the same size and shape during the fabrication process.

The output buffer 14 may be suitable for applications in both a low-speed and high-speed Universal Serial Bus devices. The output buffer 14 may receive any signal such as an internal data signal, logic block inputs and outputs in the logic device, input registers in the memory device or other such input signals.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    an output circuit configured to present a first output and a second output in response to (i) an input signal and (ii) a first control signal and a second control signal;
    an adjustment circuit configured to present said first and second control signals in response to a third control signal, wherein said adjustment circuit comprises (i) a first inverter having a first threshold and (ii) a second inverter having a second threshold; and
    a detect circuit configured to present said third control signal in response to said first and second output signals.

2. The circuit according to claim 1, wherein said adjustment circuit comprises:
    a first threshold circuit configured to generate said first control signal having an enabled state when said third control signal has a first voltage above said first threshold; and
    a second threshold circuit configured to generate said second control signal having an enabled state when said third control signal has a second voltage below said second threshold.

3. The circuit according to claim 1, further comprising:

a first edge circuit configured to present a first bias voltage on said first or second output signal in response to said first control signal; and a second edge circuit configured to present a second bias voltage on said first or second output signal in response to said second control signal.

4. The circuit according to claim 3, wherein:

said first bias voltage is generated in response to a first current source; and said second bias voltage is generated in response to a second current source.

5. The circuit according to claim 1, where said detect circuit comprises a common-mode detect circuit.

6. The circuit according to claim 1, wherein said adjustment circuit comprises a dynamic slew rate adjustment circuit.

7. The circuit according to claim 1, wherein the detect circuit and said adjustment circuit dynamically adjusts a slew rate of the first and second output signals to minimize a common-mode change between the first and second outputs.

8. The circuit according to claim 1, wherein said first output is a digital complement of said second output.

9. The circuit according to claim 1, wherein said circuit comprises a Universal Serial Bus device.

10. The circuit according to claim 1, wherein said adjustment circuit further comprises a third inverter coupled to the output of said first inverter.

11. The circuit according to claim 1, wherein said detect circuit comprises a serial connection of (i) a first resistor connected in parallel with a first capacitor and (ii) a second resistor connected in parallel with a second capacitor, said detect circuit configured to present said third control signal from a node formed by said serial connection.

12. The circuit according to claim 11, wherein said first and second capacitors provide said third control signal.

13. A circuit comprising:

means for generating a first output and a second output in response to (i) an input signal and (ii) a first control signal and a second control signal;

means for generating said first and second control signals in response to a third control signal comprising (i) a first inverter having a first threshold and (ii) a second inverter having a second threshold; and means for generating said third control signal in response to said first and second output signals.

14. A method for controlling the crossover point of a differential output buffer comprising the steps of:

(A) generating a first output and a second output in response to (i) an input signal and (ii) a first control signal and a second control signal;

(B) generating said first and second control signals in response to a third control signal generated in response to said first and second outputs, wherein said first control signal is generated by a first inverter having a first threshold and said second control signal is generated by a second inverter having a second threshold; and (C) biasing said first and second outputs in response to said first and second control signals, respectively.

15. The method according to claim 14 further comprising the step of:

generating a positive bias on said first output when said third control signal is above said first threshold.

16. The method according to claim 15, wherein said positive bias is generated in response to a first current source.

17. The method according to claim 14 further comprising the steps of:

generating a negative bias on said second output when said third control signal is below said second threshold.

18. The method according to claim 17, wherein said negative bias is generated in response to a second current source.

19. The method according to claim 14 further comprising the steps of:

generating a positive bias on said first output when said third control signal is above said first threshold; and generating a negative bias on said second output when said third control signal is below second threshold.

20. The method according to claim 19, wherein:

said positive bias is generated in response to a first current source; and said negative bias is generated in response to a second current source.

* * * * *